United States Patent [19]

Bujatti et al.

[11] Patent Number: 4,559,238
[45] Date of Patent: Dec. 17, 1985

[54] METHOD OF MAKING A FIELD EFFECT TRANSISTOR WITH MODIFIED SCHOTTKY BARRIER DEPLETION REGION

[75] Inventors: Marina Bujatti; Antonio Cetronio, both of Rome, Italy

[73] Assignee: Selenia Industrie Elettroniche Associate S.p.A., Rome, Italy

[21] Appl. No.: 399,739

[22] Filed: Jul. 19, 1982

[30] Foreign Application Priority Data

Jul. 20, 1981 [IT] Italy ................................ 48933 A/81

[51] Int. Cl.$^4$ ........................................... H01L 29/56
[52] U.S. Cl. ........................................ 427/82; 148/1.5;
29/571; 427/84; 430/314; 430/319
[58] Field of Search .................. 427/82, 84; 29/571;
148/1.5; 430/314, 319

[56] References Cited

U.S. PATENT DOCUMENTS

| | | | |
|---|---|---|---|
| 4,056,642 | 11/1977 | Saxena | 427/84 |
| 4,098,921 | 7/1978 | Calviello | 427/84 |
| 4,170,666 | 10/1979 | Pancholy | 427/82 |
| 4,172,906 | 10/1979 | Pancholy | 427/82 |
| 4,244,097 | 1/1981 | Cleary | 29/571 |
| 4,310,362 | 1/1982 | Roche | 427/84 |
| 4,426,765 | 1/1984 | Shahriary | 29/571 |

Primary Examiner—John D. Smith
Attorney, Agent, or Firm—Karl F. Ross; Herbert Dubno

[57] ABSTRACT

A method of making a field effect transistor with a modified metal semiconductor Schottky barrier depletion region wherein a GaAs semiconductive active layer on a semiinsulating substrate is supplied with a pair of ohmic contacts and with a gate or barrier electrode between the ohmic contacts and spaced therefrom so that below the surface of the active layer upon which the barrier electrode and ohmic contacts are supplied, an electron-depletion region is formed between each ohmic contact and the gate or barrier electrode. According to the invention, this surface region is treated by bombardment with nitrogen or by the application of a layer thereto to modify the depth of the depletion region so that this depth beneath the treated surface region will differ from that beneath the gate or barrier electrode.

4 Claims, 5 Drawing Figures

METHOD OF MAKING A FIELD EFFECT TRANSISTOR WITH MODIFIED SCHOTTKY BARRIER DEPLETION REGION

FIELD OF THE INVENTION

The present invention regards a MESFET (Metal Semiconductor Field Effect Transistor) type transistor and more precisely a gallium arsenide (GaAs) FET for microwave applications.

BACKGROUND OF THE INVENTION

As is well known a GaAs MESFET constitutes two parallel ohmic contacts and a gate (electrode or barrier contact) centered between these ohmic contacts positioned on a GaAs substrate which is highly doped and which itself is positioned on a semi-insulating base or substrate.

It has been shown that the performance of this device improves in terms of output power and increased operational frequency when the active layer region depleted of free electrons in the section beneath the gate and the gaps between the gate and the ohmic contacts has a greater depletion depth under the gate as compared with the gaps between the gate and the ohmic contacts. This effect is clearly in the absence of an applied voltage to the gate.

This improved performance is due to the fact that in the situation described above, the channel region which is modulated by the gate voltage is found to be better defined and the input resistance, that is the resistance of the section of active layer from the source to gate, for equal thickness of the undepleted zone in the section from the source to drain, is found to be smaller (e.g. IEEE Transaction on Electron Devices VRED-27 No. 2 February 1980).

Confirmation of the characteristics mentioned above has been obtained by realising-by means of the preceding technique a transistor with a recessed gate with respect to the surrounding area. (e.q. the IEEE pubblication already cited).

However a process for realising a recessed barrier electrode presents numerous difficulties. In particular the structure cannot be obtained when the barrier electrode is defined, that is deliniated, simultaneously with the two ohmic contacts which are parallel to it by means of a self-aligning process in which, as is well known, the barrier electrode metallization is uniformly deposited on the active layer surface and then deliniated by chemical etch.

OBJECT OF THE INVENTION

The object of this invention is to modify the depth of the electron-depletion region in the transistor channel, that is the section under the gate and in the gaps between the gate and the ohmic contacts by physical-chemical means without having to modify the structural configuration of the transistor.

SUMMARY OF THE INVENTION

According to this invention the above effect can be obtained either by reducing the depth of the depleted region under the two sections between the gate and the ohmic contacts, or by increasing the depth of the depleted region under the gate.

In the first approach we wish to point out that the extent of the active layer region depleted of free elctrons at the surface of the active layer is influenced in various ways by the substance which is in contact with the said material.

As will be shown later, in the case of an aluminum gate, for example, that the influence can be negligible but this is not the case for other materials. In fact we have observed, for example, that such a region is much deeper under a layer of silicon nitride as compared to an aluminum layer. Obviously this result is the opposite to that described for realising a situation analogous to the recessed gate.

As a result the inventors have searched for a material which when applied to the GaAs surface, produces a reduction in the depth of the depleted region.

From a first result of this search it was found that $Ga_2O_3$ reduced the depleted region depth and as such is used, according to the invention, for realising a situation analogous to the recessed gate by covering the sections of active layer between the two ohmic contacts and the gate with $Ga_2O_3$ to reduce the depth of the region depleted of electrons under the said sections.

Most recently it has been proved that the surface barrier and thus the depletion is determined by the nature of the semiconductor surface active layer and is substantially independent of the type of gate metallization (see for example, "Reactivity and interface chemistry during Schottly-barrier formation of metals on the native oxide of GaAs investigated by X-ray photoelectron spectroscopy" by S. P. Kowalczyk; J. K. Waldrop, R. W. Grant in Applied Phys. Lett., 38 (3) 2 Feb. 1981).

Based on this result, the inventors have perfected a second procedure for modulating the depleted region of the active layer which avoids the solution of having to recess the gate.

This procedure consists in treating the section of the active layer surface which is destined to be covered by the gate in such a way as to increase the surface barrier, that is the potential difference between the surface and the bulk of the active layer, which corresponds to a deepening under that section of the region of the active layer depleted of electrons.

The surface treatment which constitutes an important aspect of the invention consists in subjecting to sputtering (ionic bombardment, with nitrogen) the section of surface in question. The sputtering must be light, that is at low power (circa 100 W) and of relatively short duration (circa 2 minutes) in order not to erode away the active layer.

The intermediate sections between the gate and the ohmic contacts are not treated and as such the depleted region under these sections corresponds to the usual 0.70 V barrier which is typically created by the native oxides.

The mechanism with which deepning of the depletion region is obtained is still not clear, most probably it is an effect of preferential sputtering which creates a "shortage" (vacancy) of As or Ga atoms which in turn behave like negative charges causing an increase in potential between the surface and the bulk and thus determining a deeping of the depleted region.

For further clarification of the concepts of the realisation procedures presented according to this invention the following illustrative diagrams have been included.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
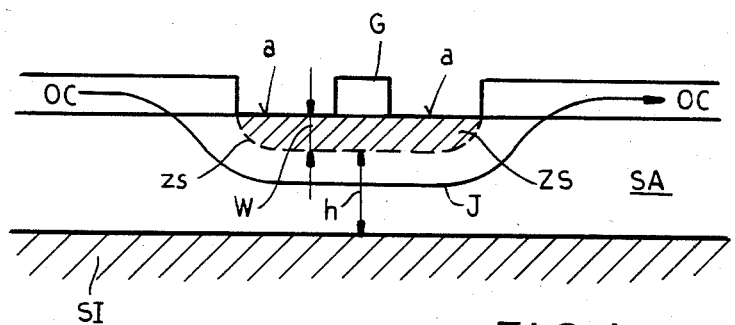
FIGS. 1 and 2 are cross sectional views showing prior art versions of the depletion region without modification and with modification by recessing the gate, respectively.

FIG. 1 is a schematic representation of a GaAs field effect transistor produced by a current technique. G indicates the "gate" (i.e. barrier electrode) and OC indicates the ohmic contacts; the active layer SA is applied to a semi-insulating substrate SI; the region ZS depleted of electrons in the active layer is deliniated by the dashed line while J represents the electron flux. The active layer SA is highly doped ($n \approx 10^{17}$ cm$^{-3}$) and thin (0.3 μm). From FIG. 1 the depth W of the depleted region under the gate G and the intervals between each of the ohmic contacts and the gate in absence of the applied voltage is clearly evident. The depth W corresponds to the normal barrier of 0.7 eV typically created by the native oxides.

Figure 2:
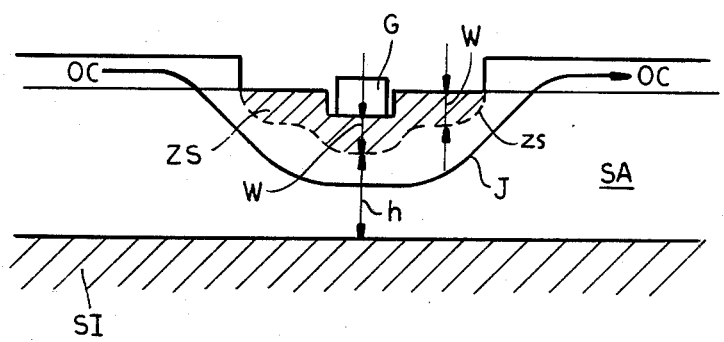

In FIG. 2 where the symbols are analogous to those in FIG. 1, an analogous transistor illustrating the system proposed in the IEEE publication cited above has been shown. The gate G is recessed into a trough parallel to the ohmic contacts OC. From this diagram the particular behavior of the depleted region under the gate and under the gaps between the gate and the ohmic contacts is shown. That is FIG. 2 reveals that the depleted region penetrates into the active layer under the gate more than in the sections under the said gaps. In practice the boundary of the depleted region follows the profile of the active layer surface.

Figure 3:
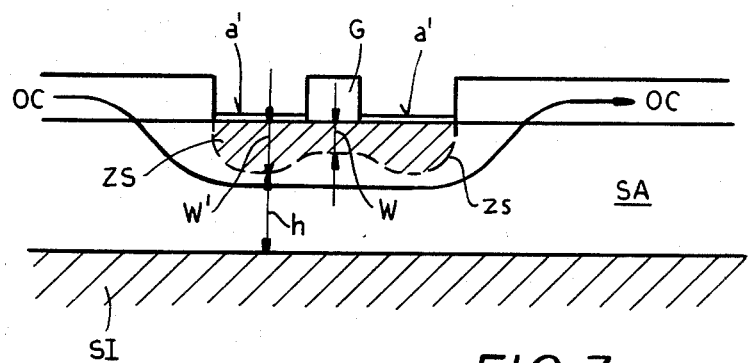
FIGS. 3-5 are similar views showing modification of the depletion region in accordance with the principles of this invention.

In FIG. 3, for clarification, the effect of a layer a′ of silicon nitride deposited between the gaps between the gate G and the ohmic contacts OC is illustrated. This confirming the possibility of varying the depth (W′>W) of the depleted region by covering the active layer in the section between the gate and the ohmic contacts with a suitable material.

Figure 4:
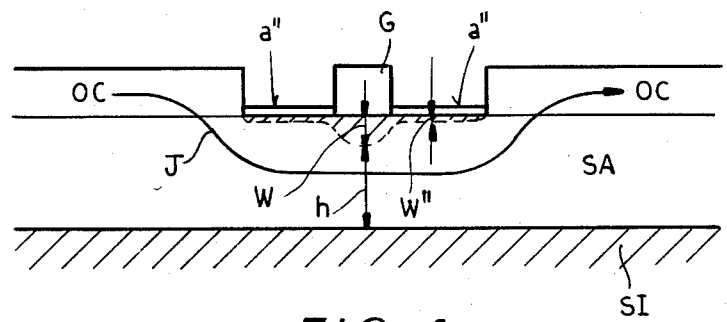

FIG. 4 illustrates the effect obtained by applying the technique described in this invention accroding to the first realisation of the said transistor.

The procedure for obtaining the above transistors includes the following phases, removing the native oxide from the channel region of the transistor;

forming in contact with the surface of the active layer between the gate and the ohmic contacts a layer of gallium oxide.

This can be obtained either by evaporating Ga onto the surface, and then oxidizing it, or by oxidising the surface of GaAs after having rendered it starved of arsenic by means of a thermal treatment, obtaining in this way a layer a″ of $Ga_2O_3$. From the figure we note the diminished depth W″ of the depleted region under the intervals between the gate and the ohmic contacts after the surface treatment of these intervals with a formation of $Ga_2O_3$.

The second procedure includes the following phases.
The transistor channel is masked with photoresist, leaving uncovered the area a‴ which is destined to be covered by the gate.

The transistor is subjected to a bombardment (sputtering) with ions of $N_2$ at a low power (circa 100 W) for approximately 2 minutes.
The photoresist is eliminated
the gate metallisation is deposited.

Figure 5:
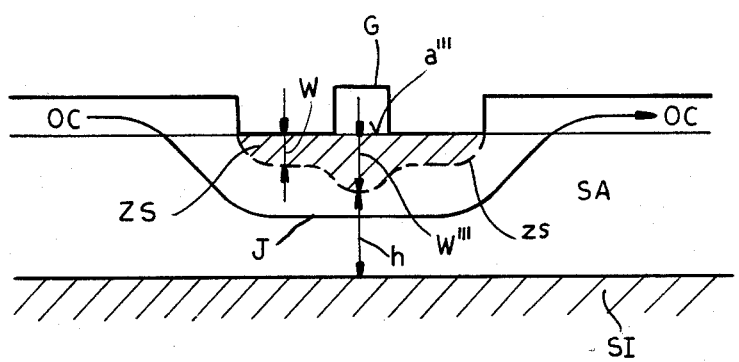

FIG. 5 illustrates a transistor realised by this second technique. From this; the greater depth w‴ of the depleted region under the gate with respect to the depth w of the same region in the sections under the intervals between the gate G and the ohmic contacts OC is evidenced. In these intervals, respectively between the source and gate and drain and gate the depth w has remained unchanged, corresponding to the usual 0.7 eV barrier, typically created by the native oxides.

Note that in all the figures the dimension h, that is the minimum depth of the undepleted region of the active layer does not vary, this to indicate that the best performances of a transistor with modulated depleted region according to the realisation methods of the present invention illustrated in FIGS. 4 and 5 does not depend on the layer or smaller passage section of the electron flux J but on the different depth of the depleted region under the gate and under the sections between the gate and the ohmic contacts. That is, on the particular behavior of the surface which defines the depleted region in the bulk of the active layer illustrated in FIGS. 2, 4 and 5.

We have described two prefered realisation techniques of the invention. It is clearly obvious that experts in this field are capable of making numerous modifications and variations.

In particular with reference to the first realisation technique it will be possible to in other materials instead of gallium oxide with which to cover the interval between the gate and the ohmic contacts to reduce the depth of the depleted region under this section.

It is also possible to overlap the procedures of the two realisation techniques described obtaining in this way cumulative effects on the transistor.

Variation of this type do not invalidate the informative concept of the present invention which is that of realising a depth of the depleted region which is greater under the gate rather than under the intervals between the gate and the ohmic contacts, with surface treatments of the active layer instead of modifying the geometry of the channel. With the following claims we intend as such to protect all those modifications and variations which enter in the above mentioned informative concept of the invention.

We claim:
1. A method of making a field effective transistor with a modified metal semiconductor Schottky barrier depletion zone which comprises:
   forming a GaAs active semiconductor layer upon a semi-insulating substrate and applying to a surface of said active layer opposite said substrate, a pair of spaced apart ohmic contacts and a barrier electrode forming a gate between said ohmic contacts and at the same level thereof, whereby an electron depletion region is formed below said surface between said ohmic contacts and beneath said electrode; and
   modifying the depth of said region so that the depth of said region between said ohmic contacts and said electrode differs from the depth of said region below said electrode by at least one of the steps of:
      subjecting the surface below said barrier electrode prior to the application of said barrier electrode to said surface to an ion bombardment in nitrogen gas for a period of substantially 1 to 2 minutes at an intensity of up to about 100 watts, and depositing a gallium oxide on said surface between said electrode and said ohmic contacts.

2. The method defined in claim 1 wherein gallium is initially deposited on said surface between said ohmic contacts and said electrode and is thereafter transformed to gallium oxide.

3. The method defined in claim 2 wherein the gallium oxide is deposited on said surface by the steps of:

masking said layer with a photoresist leaving uncovered only areas of said surface corresponding to areas between said ohmic contacts and said electrode;

removing native oxide from said surface in said uncovered areas;

vapor depositing a film of gallium upon said surface in the areas in which native oxide has been removed;

removing a photoresist from said layer; and oxidizing said gallium film to $Ga_2O_3$ in an oxygen atmosphere.

4. The method defined in claim 1 wherein the ion bombardment is carried out for about 2 minutes and the depth of said region is modified by the steps of:

masking said layer with a photoresist leaving uncovered only an area subsequently to be covered by said barrier electrode;

subjecting said layer to said bombardment in the uncovered area;

removing the photoresist from said layer; and depositing metal on said area to form said barrier electrode.

* * * * *